United States Patent
Martyna et al.

(10) Patent No.: US 11,594,574 B2
(45) Date of Patent: Feb. 28, 2023

(54) PIEZO-JUNCTION DEVICE

(71) Applicant: INTERNATIONAL BUSINESS MACHINES CORPORATION, Armonk, NY (US)

(72) Inventors: Glenn J. Martyna, Croton on Hudson, NY (US); Kirsten Emilie Moselund, Rüschlikon (CH); Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 15/898,240

(22) Filed: Feb. 16, 2018

(65) Prior Publication Data

US 2019/0259805 A1   Aug. 22, 2019

(51) Int. Cl.
| | |
|---|---|
| *H01L 27/20* | (2006.01) |
| *H01L 29/66* | (2006.01) |
| *H01L 41/047* | (2006.01) |
| *H01L 41/187* | (2006.01) |
| *H01L 29/84* | (2006.01) |
| *H01L 41/09* | (2006.01) |

(52) U.S. Cl.
CPC ........ *H01L 27/20* (2013.01); *H01L 29/66212* (2013.01); *H01L 29/66318* (2013.01); *H01L 29/84* (2013.01); *H01L 41/047* (2013.01); *H01L 41/0986* (2013.01); *H01L 41/187* (2013.01); *H01L 41/1876* (2013.01)

(58) Field of Classification Search
CPC ......... H01L 41/311; H01L 27/20; H01L 49/00
See application file for complete search history.

(56) References Cited

U.S. PATENT DOCUMENTS

| | | | | |
|---|---|---|---|---|
| 3,357,698 | A * | 12/1967 | Flynn | ............... B25B 5/101 269/221 |
| 3,482,189 | A * | 12/1969 | Fenner | ............ H01S 5/0607 372/20 |
| 8,330,154 | B2 | 12/2012 | Wang et al. | |
| 10,153,421 | B1 * | 12/2018 | Cripe | ................. H01L 49/00 |
| 2009/0230441 | A1 * | 9/2009 | Schwarzmann | ........ H01L 27/20 257/288 |

(Continued)

OTHER PUBLICATIONS

J S Harris et al, Phys Rev B, 1, 1660, 1970) (Year: 1970).*

(Continued)

*Primary Examiner* — Samuel A Gebremariam
*Assistant Examiner* — Jonas T Beardsley
(74) *Attorney, Agent, or Firm* — Daniel P. Morris; Nick Cadmus; Lou Percello, Attorney, PLLC

(57) ABSTRACT

A piezo-junction device may be provided. The piezo-junction device comprises a piezoelectric element comprising two electrodes and piezoelectric material in-between, and a semiconductor junction device adjacent to the piezoelectric element such that one of the two electrodes of the piezoelectric element is in contact with the semiconductor junction device connecting the semiconductor junction device and the piezoelectric element electrically in series. Thereby, the semiconductor junction device and the piezoelectric element are together positioned in a fixed mechanical clamp such that the piezoelectric element with an applied electrical field applies strain to the semiconductor junction device causing a change in Fermi levels of the semiconductor junction device.

11 Claims, 3 Drawing Sheets

(56) References Cited

U.S. PATENT DOCUMENTS

| | | | |
|---|---|---|---|
| 2012/0306319 A1 | 12/2012 | Park | |
| 2013/0009668 A1* | 1/2013 | Elmegreen | H01L 49/00 29/25.35 |
| 2013/0221806 A1 | 8/2013 | Sohn et al. | |
| 2015/0255699 A1* | 9/2015 | Elmegreen | H01L 49/00 310/366 |
| 2017/0325030 A1* | 11/2017 | Stoppel | H04R 17/00 |

OTHER PUBLICATIONS

Electronic Structure of Samarium Monopnictides and Monochalcogenides; Svan et al; arXiv 2004 (Year: 2004).*

Liu et al., "Effect of hydrostatic pressure on the dc characteristics of AlGaN / GaN heterojunction field effect transistors," Citation: Appl. Phys. Lett. 88, 013505 (2006); doi: 10.1063/1.2161812, Published by the American Institute of Physics, 2006 (Best Date Available), pp. 013505-1-013505-3.

Mookerjea et al., "Experimental Demonstration of 100nm Channel Length In (0.53) Ga (0.47) As-based Vertical Inter-band Tunnel Field Effect Transistors (TFETs) for Ultra Low-Power Logic and SRAM Applications," 2009 IEEE International Electron Devices Meeting (IEDM 2009), Dec. 7-9, 2009, pp. 1-3.

Solomon et al., "Pathway to the Piezoelectronic Transduction Logic Device," NANO Letters, DOI: 10.1021/nl5046796, Nano Lett. 2015, 15, Copyright 2015 American Chemical Society, Published: Mar. 20, 2015, pp. 2391-2395.

Wang, "Piezotronics: A new field of strain-engineered functional semiconductor devices", American Ceramic Society Bulletin, vol. 92, No. 6, 2013 (Best Date Available), pp. 18-28.

Wortman et al., "Effect of Mechanical Stress on p-n Junction Device Characteristics," AIP, Journal of Applied Physics, Citation: Journal of Applied Physics, vol. 35, No. 7, (1964); doi: 10.1063/1.1702802, Published by the AIP Publishing, Jul. 1964, pp. 2122-2131.

Zhou et al., "Flexible Piezotronic Strain Sensor," Nano Letters, 2008, vol. 8, No. 9, Received Aug. 4, 2008, Published on Web Aug. 16, 2008, Copyright 2008 American Chemical Society, pp. 3035-3040.

Zhou et al., "Piezoelectric-Potential-Controlled Polarity-Reversible Schottky Diodes and Switches of ZnO Wires," Article in Nano Letters, vol. 8, No. 11, 3973-3977, Published on Web Sep. 30, 2008, Copyright 2008 American Chemical Society, Oct. 2008, pp. 3973-3977.

* cited by examiner

PIEZO-JUNCTION DEVICE

BACKGROUND

The invention relates generally to a piezo-junction device and a method for operating the piezo-junction device. The piezo-junction device may comprise a piezoelectric element and at least a semiconductor junction device.

Piezoelectric devices have been known for a long time. They are based on the piezoelectric principle to convert either a deformation induced by physical forces into electrical energy or a deformation of a piezoelectric material by applying an electrical field to the piezoelectric material. Those devices are typically implemented as thick-film devices.

Piezoelectric devices have also been combined with devices showing the piezo-resistive effect. The piezo-resistive effect is a change in the electrical resistivity of the semiconductor or metal when mechanical strain is applied. In contrast to the piezoelectric effect, the piezo-resistive effect causes a change only in electrical resistance, not in the electrical potential. The resistance change by strain has usually both, a geometric and a piezo-resistive component. That geometric effect dominates in many methods. There may be different components in the piezo-resistive effect: a longitudinal, a traverse and a shear component. The dominant effect may depend on the material chosen, the crystal orientation, the temperature, etc. Materials may be found (at least theoretically) for which either one effect dominates—in particular, a pure longitudinal response. Piezo-resistivity is typically a bulk effect, and has in most cases a quasi-linear dependence on the amount of strain applied.

SUMMARY

According to one aspect of the present invention, a piezo-junction device may be provided. The piezo-junction device may comprise a piezoelectric element comprising two electrodes and piezoelectric material in-between, and a semiconductor junction device adjacent to the piezoelectric element, such that one of the two electrodes of the piezoelectric element may be in contact with the semiconductor junction device connecting the semiconductor junction device and the piezoelectric element electrically in series. Thereby, the semiconductor junction device and the piezoelectric element may together be positioned in a fixed mechanical clamp such that the piezoelectric element with an applied electrical field may apply strain to the semiconductor junction device causing a change in Fermi levels of the semiconductor junction device.

According to another aspect of the present invention, a method for operating a piezo-junction may be provided. The used piezo-junction may comprise a piezoelectric element comprising two electrodes and piezoelectric material in-between, and a semiconductor junction device adjacent to the piezoelectric element, such that one of the two electrodes of the piezoelectric element may be in contact with the semiconductor junction device connecting the semiconductor junction device and the piezoelectric element electrically in series, where the semiconductor junction device and the piezoelectric element may together be positioned in a fixed mechanical clamp.

The method may comprise applying an electrical field to the two electrodes contact of the piezoelectric element resulting in an applied strain to the semiconductor junction device causing a change in Fermi levels of the semiconductor junction device.

It may be noted that instead the change in Fermi levels also another physical mechanism such as bandgap deformation which might impact the current passing through the semiconductor junction device could be used, or might occur simultaneously.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
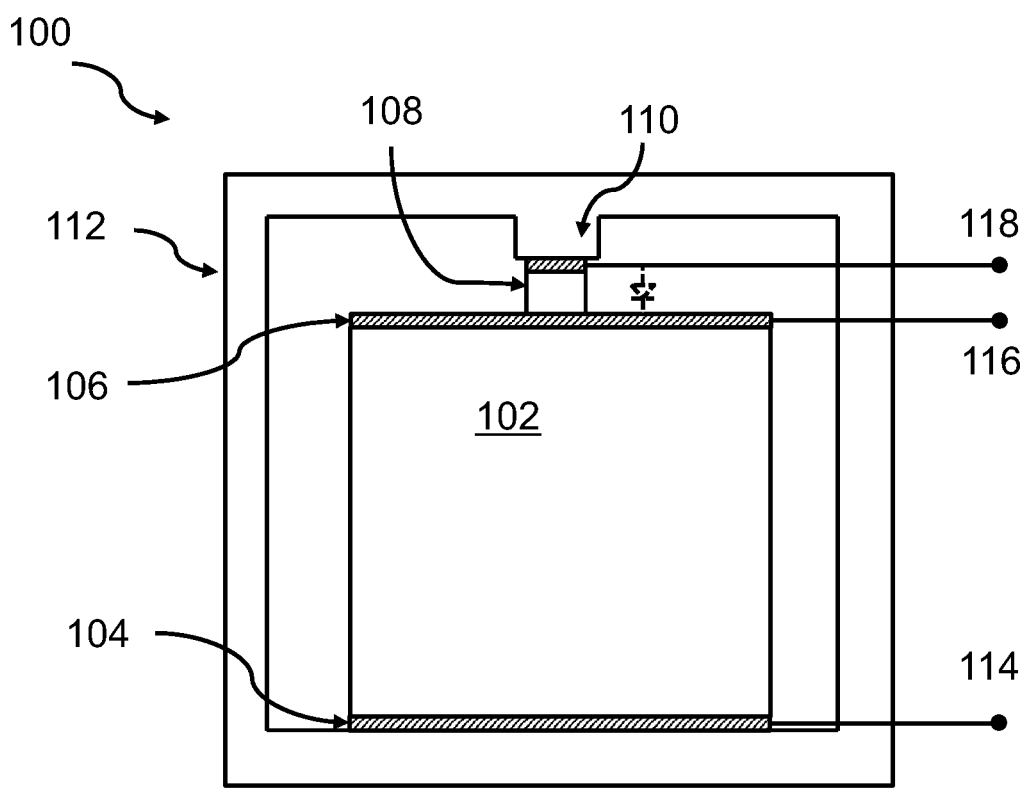

Preferred embodiments of the invention will be described, by way of example only, and with reference to the following drawings:

FIG. 1 shows a block diagram of a first embodiment of the inventive piezo-junction device.

Figure 2:
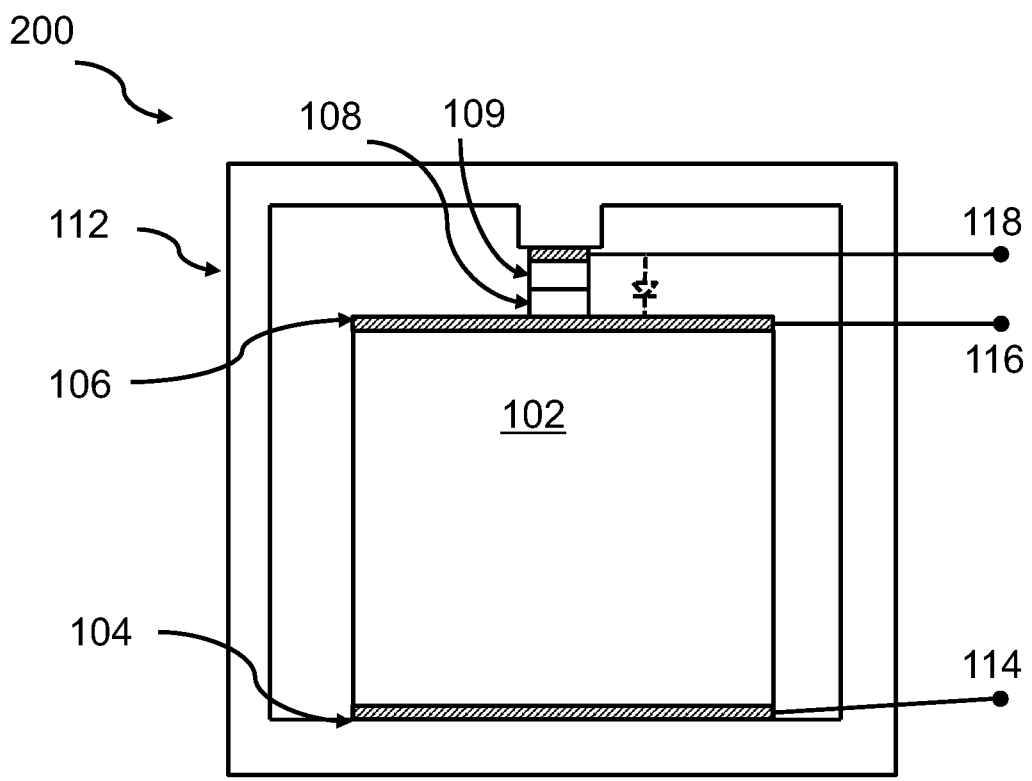

FIG. 2 shows a block diagram of a second embodiment of the inventive piezo-junction device.

Figure 3:
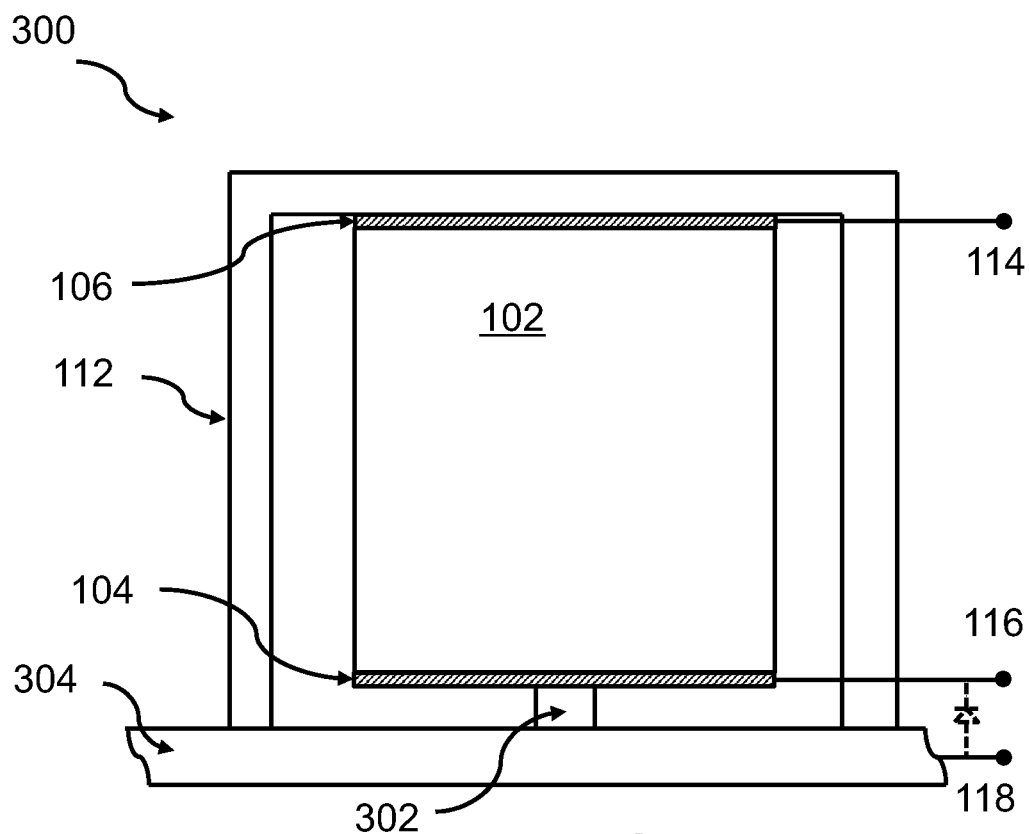

FIG. 3 shows a block diagram of a third embodiment of the inventive piezo-junction device.

Figure 4:
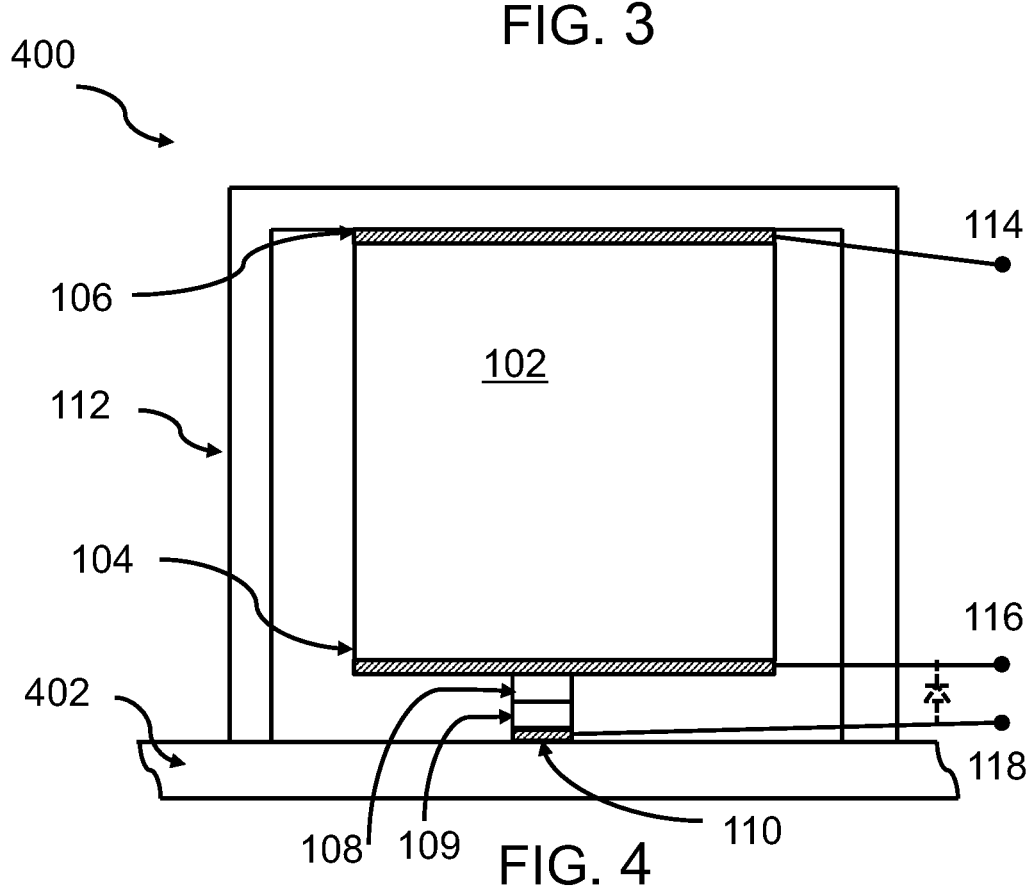

FIG. 4 shows a block diagram of a fourth embodiment of the inventive piezo-junction device.

Figure 5:
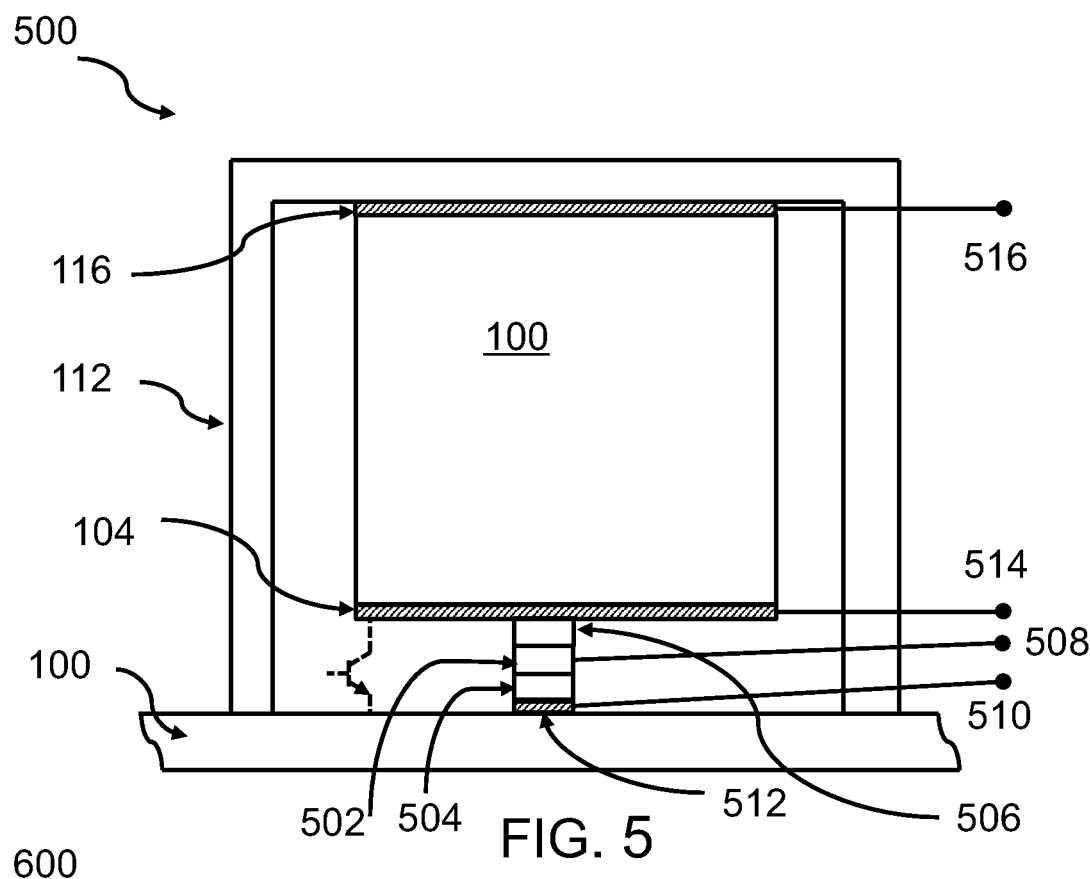

FIG. 5 shows a block diagram of a fifth embodiment of the inventive piezo-junction device.

Figure 6:
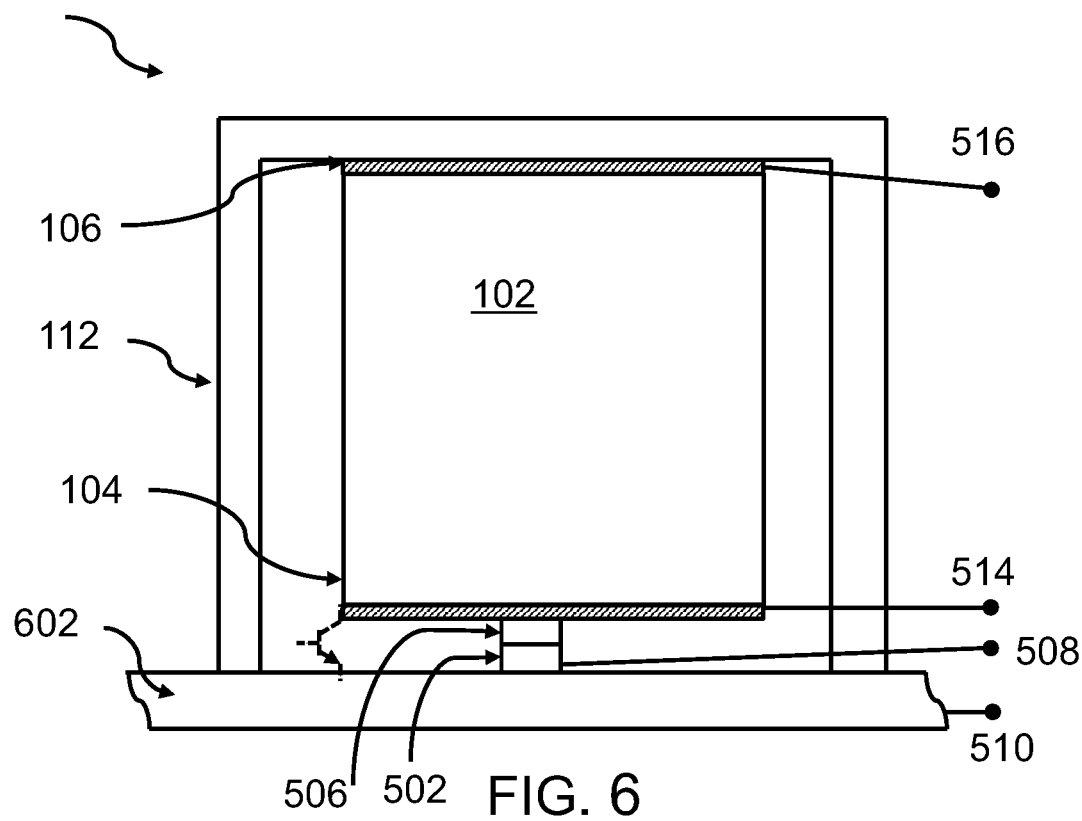

FIG. 6 shows a block diagram of a sixth embodiment of the inventive piezo-junction device.

DETAILED DESCRIPTION

In the context of this description, the following conventions, terms and/or expressions may be used:

The term 'piezoelectric element' may denote an electrical device showing the piezoelectric effect by which a piezoelectric material in an electric field—typically applied by top and bottom electrodes—depending on the direction of the electrical field, expand or contract. The piezoelectric effect may be understood as the linear electromechanical interaction between the mechanical and the electrical state in crystalline materials with no inversion symmetry. The piezoelectric effect is a reversible process in that materials exhibiting the direct piezoelectric effect (the internal generation of electrical charge resulting from an applied mechanical force) also exhibit the reverse piezoelectric effect (the internal generation of a mechanical strain resulting from an applied electrical field). For example, lead zirconate titanate crystals may generate measurable piezoelectricity when their static structure is deformed by about 0.1% of the original dimension. Conversely, those same crystals will change about 0.1% of their static dimension when an external electric field is applied to the material. The inverse piezoelectric effect is used in the production of ultrasonic sound waves.

The term 'piezoelectric material' may denote a bulk material showing the piezoelectric effect.

The term 'semiconductor junction device' may denote an electronic device based on a semiconductor junction which should be understood as a boundary or interface between two types of semiconductor material—p-type and n-type—inside a single crystal of a semiconductor or a metal/semiconductor junction. The "p" (positive) side contains an excess of holes (missing electrons), while the "n" (negative) side contains an excess of electrons. The p-n junction is created by doping.

The term 'fixed mechanical clamp' may denote a yoke representing a quasi-non-deformable frame in which other mechanical structures may be inserted. If the other mechanical structures may be deformed, the fixed mechanical clamp continues to keep its original shape, i.e., it is not deformed. One may also say that it is stiff, rigid or has a high Young's modulus which may be understood as a measure of the stiffness of a solid material. It is a mechanical property of linear elastic solid materials. It defines the relationship between stress (force per unit area) and strain (proportional deformation) in a material. Thus, the term 'high Young's modulus yoke' may denote a rigid or stiff frame having a Young's modulus whose value is higher than the material positioned within the yoke or frame.

The term 'Fermi level' may denote the total chemical potential for electrons (or electrochemical potential for electrons) and may usually be denoted by $\mu$ or $E_F$. The Fermi level of a body is a thermodynamic quantity, and its significance is the thermodynamic work required to add one electron to the body (not counting the work required to remove the electron from wherever it came from). In band structure theory, used in solid state physics to analyze the energy levels in a solid, the Fermi level can be considered to be a hypothetical energy level of an electron, such that at thermodynamic equilibrium this energy level would have a 50% probability of being occupied at any given time. The position of the Fermi level with the relation to the band energy levels is a crucial factor in determining electrical properties. The Fermi level does not necessarily correspond to an actual energy level (e.g., in an insulator the Fermi level lies in the band gap), nor does it require the existence of a band structure. Nonetheless, the Fermi level is a precisely defined thermodynamic quantity. It may also be understood that by the deformation of the semiconductor crystal, a shift of the Fermi level is likely not the sole effect, and that other effects such as a change in band structure, polarization or in the crystal anisotropy might occur simultaneously, which might also impact the current through the semiconductor junction device.

The term 'bipolar transistor' (or junction transistor) may denote a type of transistor that uses both electron and hole charge carriers. In contrast, unipolar transistors, such as field-effect transistors, only use one kind of charge carrier. For their operation, bipolar transistors may use two junctions between two semiconductor types, n-type and p-type. One may differentiate between npn and pnp bipolar transistors.

The term 'Schottky diode', also known as hot carrier diode, may denote a semiconductor diode formed by the junction of a semiconductor with a metal. It may have a low forward voltage drop and a very fast switching action. A metal-semiconductor junction may be formed between a metal and a semiconductor, creating a Schottky barrier (instead of a semiconductor-semiconductor junction as in conventional diodes). Typical metals used are molybdenum, platinum, chromium or tungsten, and certain silicides (e.g., palladium silicide and platinum silicide), whereas the semiconductor would typically be n-type silicon due to the higher electron mobility in silicon, as opposed to holes. The metal side may act as the anode, and n-type semiconductor may act as the cathode of the diode. The Schottky barrier excels in both, very fast switching and low forward voltage drop, with some degree of tunability.

The term 'tunnel diode' may denote a pn junction comprising a heavily doped pn junction that is about 10 nm wide. The heavy doping results in a 'broken band gap' with the application of a strong reverse bias, where conduction band electron states on the n-side are more or less aligned with valence band hole states on the p-side. When used in the reverse direction, tunnel diodes may be called back diodes (or backward diodes) and can act as fast rectifiers with zero offset voltage and extreme linearity for power signals (they have an accurate square law characteristic in the reverse direction). Under reverse bias, filled states on the p-side become increasingly aligned with empty states on the n-side and electrons now tunnel through the pn junction barrier in reverse direction.

The proposed piezo-junction device may offer multiple advantages and technical effects:

The proposed inventive concept is comparably flexible in its implementation. A variety of different layers structures may be used. The piezoelectric device may be over the semiconductor junction device or below if a substrate may be taken as lower reference plane. Due to the change of the Fermi level in the semiconductor junction device, the change of the related voltage/current characteristic is varying exponentially depending on the strain injury used by the piezoelectric device. Thus, semiconductor devices—e.g., different types of diodes, as well as, bipolar transistors—may be manufactured having adjustable characteristics. Hence, a gain curve of the transistor may be adjustable "in a living device".

However, depending on the material used it can be either a bulk-like effect in the semiconductor junction device associated to a change in the Fermi level, or in, for example, polar semiconductors, it may also be related to polarization effects at an interface.

In contrast to a piezo-resistive device combined with a piezoelectric device, the change in the voltage/current is much more significant and much more efficient. The resulting piezo-junction devices are much better suited for real-life applications in, e.g., low-power IoT (Internet of Things) devices.

Furthermore, the proposed concepts are not limited to the semiconductor pn junction but may also be applied to a Schottky diode, as well as, bipolar transistors of either type: npn or pnp. There are no limitations regarding a layer sequence—p-n or n-p, semiconductor-metal or metal-semiconductor, npn or pnp transistor—all variants may be equally possible allowing a high degree of design freedom for a device implementation of the inventive concept.

It might also be technologically much simpler to implement in a Si CMOS process. Most piezo-resistive materials are fairly exotic not compatible with silicon CMOS processing technology, whereas for the present invention silicon or other conventional semiconductors and metals might be used.

The above, translates into a greater flexibility in design, such that the relative position of the piezoelectric layer and the piezo junction device might be interchanged or more exotic geometries might be exploited.

Further advantages may be a low operating voltage combined with high speed. Low operating voltage is possible because the device escapes from the Boltzmann limitation (60 meV per decade) on switching in MOS devices. The power requirement scales as the square of the operating voltage, hence, a large power reduction is possible. This is important as, e.g., the large power requirements in server farms are becoming a concern in terms of cost, siting requirements, etc.

It may also be mentioned that the newly proposed device may be used as new tape of switching element in any logic application, in particular in low-power applications such as IoT devices.

In the following, additional embodiments of the piezo-junction device, as well as the related method will be described:

According to one advantageous embodiment of the piezo-junction device, the semiconductor junction device may be selected out of the group comprising a semiconductor pn junction—i.e. a diode—a bipolar transistor, and a Schottky diode. Thus, a homo-junction diode, a bipolar transistor—either npn or pnp—as well as a Schottky diode may be one of the elements in the piezo-junction device. Consequently, a plurality of different characteristic curves—i.e., dependency between voltage and current—may be implemented.

It may be noted that all known metal/semiconductor combinations may also be used as part of the proposed piezo-junction device. Also, any known semiconductor junction (homo-junction) material combination (hetero-junctions) may be used as part of the proposed piezo-junction device.

According to one permissive embodiment of the piezo-junction device, the a collector electrode of the bipolar transistor may be the one of the two electrodes in contact with an n-type or p-type semiconductor material of the piezoelectric element, a base of the bipolar transistor may be an electrode connected to a semiconductor material of different polarity (or different type) than the semiconductor material in contact with the piezoelectric element electrode, and an emitter of the bipolar transistor is a substrate of a same doping type as the collector semiconductor material. Hence, the general layout of the piezo-junction device is, apparently simple. pnp layering, as well as npn layering may be implemented.

According to one alternative embodiment of the piezo-junction device, a collector electrode of the bipolar transistor is the one of the two electrodes in contact with an n-type or p-type semiconductor material of the piezoelectric element, a base of the bipolar transistor is an electrode connected to a semiconductor material of or different polarity (or different type) than the semiconductor material in contact with the piezoelectric element electrode, and an emitter contact of the bipolar transistor is a contact layer arranged between an emitter semiconductor material having the same doping type as the emitter semiconductor material and a substrate. This may save one explicit layer for the bipolar transistor and thus reduce the complexity of the device and efforts in the production process.

According to one useful embodiment of the piezo-junction device, the piezo-junction device may be positioned over, or directly atop, a substrate. As mentioned above, a silicon substrate may also be part of the structure. The substrate may also be part of the fixed mechanical clamp. It may also be possible to use a substrate (e.g., silicon) having an oxide layer on its surface.

According to a further preferred embodiment of the piezo-junction device, the fixed mechanical clamp may be a high Young's modulus yoke. The high Young's modulus yoke may be needed, in particular, to resist the force of the piezoelectric electric device of the piezo-junction device.

According to an optional embodiment of the piezo-junction device, the substrate may be a portion of the high Young's modulus yoke, as well as of the semiconductor junction device. This may allow to reduce the number of layers required and thus, to reduce the complexity of the manufacturing process. The yoke of fixed mechanical clamp may advantageously be implemented as a micro-cavity in a bulk silicon material. The high Young's modulus may typically have a value between 100 and 300 GPa. This way, it may continue to be stiff if the piezoelectric device develops a pressure of up to 10 GPa.

According to one (additional advantageous embodiment of the piezo-junction device, a relation of a cross section of the piezoelectric element to a cross section of the semiconductor junction device is 25:1, or larger. This may ensure that the piezoelectric element can produce enough strain in the junction device in order to manipulate a Fermi level and thus, to generate an effective reaction of the junction device.

According to one preferred embodiment of the piezo-junction device, the applied strain to the semiconductor junction device causing a change in Fermi levels of the semiconductor junction device is such that a current/voltage characteristic of the semiconductor junction device is changed—in particular, changed significantly by a factor of e.g., 10 up to $10^4$. This is possible because the current/voltage characteristic is changing exponentially if compared to a piezo-resistive material.

According to one additionally permissive embodiment of the piezo-junction device, the piezoelectric device may be oriented towards the substrate or the semiconductor junction device may be oriented towards the substrate. Hence, the sequence of the piezoelectric device and the semiconductor junction may be flipped upside down without a general influence on the function of the Piezo-junction device. However, as it turns out, having the piezoelectric device on top or over, the junction device opens up more technical alternatives if the substrate may be sued as bottom reference plane.

According to further embodiments of the piezo-junction device, the semiconductor junction device may be a homo-junction device—in particular, comprising same material which may be differently doped—or a heterojunction device—in particular, comprising different semiconductor materials (e.g., III-V semiconductor junctions). Thus, the proposed piezo-junction device is not limited to one form of semiconductor junction device.

According to allowable embodiments of the piezo-junction device, an active portion of the piezoelectric device may be selected out of the materials ZnO, lead zirconate titanate (($Pb[Zr_xTi_{1-x}]O_3$ with 0<x<1), $PbTiO_3$, $La_3Ga_5SiO_{14}$, $GaPO_4$, $LiNbO_3$, $LiTaO_3$, $BaTiO_3$, $KNbO_3$, $Na_2WO_3$, $Ba_2NaNb_5O_5$, $Pb_2KNb_5O_{15}$, $BiFeO_3$, $NaNbO_3$, $BaTiO_3$, $Bi_4Ti_3O_{12}$, $NaBi(TiO_3)_2$. Hence, a broad range of materials is available and may be selected according to specific design criteria of the piezo-junction device.

According to an advantageous embodiment of the piezo-junction device, the semiconductor junction device may be a forward biased pn diode or a reverse biased tunnel diode. Also, these options allow a high flexibility in using the newly proposed device.

According to one preferred embodiment of the piezo-junction device, one electrode of the diode is one of the two electrodes of the piezoelectric element in contact with a semiconductor layer of the diode, and a second electrode of the diode is arranged between a second semiconductor material of the pn junction and a substrate. Reusing intermediate layers or contact layer for both devices, the piezoelectric device and the semiconductor junction device may help to reduce the required number of layers and thus the manufacturing process.

In the following, a detailed description of the figures will be given. All instructions in the figures are schematic. Firstly, a block diagram of an embodiment of the inventive piezo-junction device is given. Afterwards, further embodiments, as well as embodiments of the method for operating the piezo-junction device, will be described.

FIG. 1 shows a block diagram of a first embodiment 100 of the inventive piezo-junction device. The piezoelectric device 102 comprises piezoelectric material between a lower electrode 104 and an upper electrode 106. Over, or atop, the upper electrode 106 a semiconductor material 108 is deposited. On the top of the semiconductor material 108, a metal contact 110 is deposited. A Schottky contact to the semiconductor material 108 is formed atop at least one of the metal interfaces 106 or 110, and a double Schottky contact may also be chose.

Both, the Schottky diode and the piezoelectric device 102 are positioned within a rigid frame 112 in the form of a yoke with a high Young's modulus. The value of the Young's modulus can be in the range between 100 and 300 GPa. Thus, it is able to sustain strain developed by the piezoelectric device 112 if an electrical field is applied between a common terminal 116 and a gate terminal 114. The common terminal is connected to the upper electrode 106, whereas the lower electrode 104 is connected to the gate terminal 114. The metal layer 110 atop the semiconductor 108 may be connected to a sense terminal 118.

Once the electric field is applied to the common and gate terminals 116, 114 strain is applied to the Schottky diode moving the Fermi levels which can be understood as an equivalent to a shifting of the voltage/current characteristic of the Schottky diode, hence changing the amount of current flowing through the sense terminal 118. An equivalent circuit diagram of the Schottky diode is shown in dashed lines between the upper electrode 106 of the piezoelectric device 102 and the metal electrode 110.

FIG. 2 shows a block diagram of a second embodiment 200 of the inventive piezo-junction device. The reference numerals used are identical to those of FIG. 1. The main difference if compared to FIG. 1 is that in FIG. 2 not a Schottky device (comprising the semiconductor 108 and the metal layer 110) but a homo-junction device comprising differently doped semiconductor material layer 108 and 110 are used instead. Also here, the equivalent circuit diagram of a forward biased pn diode is shown in dashed lines if the semiconductor 109 is a p-type material and semiconductor material 108 is an n-type material. Alternatively, the posing types may be exchanged (n-type above p-type).

It may also be noted that a simple diode may only be one way of an implementation, whereas a double Schottky back-to back (like the Ag—ZnO—Ag) would provide symmetric response with opposite strain.

FIG. 3 shows a block diagram of a third embodiment 300 of the inventive piezo-junction device. The general concept is unchanged. However, here, the piezoelectric device 102 sits on top, and an n-type semiconductor material is deposited on a p-type substrate 304. This way the homo-junction is built between the p-type substrate 304 and the n-type semiconductor element/layer 302. Again, both, the piezoelectric device 102 and the semiconductor junction device comprising the p-type substrate and the layer of the n-type semiconductor 302 sits within a stiff and/or rigid yoke or fixed mechanical clamp 112. In this case, the gate terminal 114 is equivalent to the upper electrode 106 of the piezoelectric device 102, the common terminal 116 is equivalent to the lower electrode 104, and the sense terminal 118 is connected to the p-type substrate 304.

FIG. 4 shows a block diagram of a fourth embodiment 400 of the inventive piezo-junction device. Basically, this embodiment is equivalent to the embodiment of FIG. 2 in an upside down fashion. Now, the piezoelectric device 102 is adjacent to an upper portion of the yoke 112 and the sequence semiconductor layers 108 (n-type), 109 (p-type) is reversed. The metal layer 110 may now be arranged over the top a substrate 402. The terminals are equivalent to FIG. 3, as well as, the equivalent circuit diagram of the diode.

FIG. 5 shows a block diagram of a fifth embodiment 500 of the inventive piezo-junction device. In this case, a complete bipolar transistor comprising an n-type layer 506, a p-type layer 502 and an n-type layer 504. The base terminal of the transistor may be connected to the p-type layer 502 connected to the terminal 508. The emitter terminal 510 is connected to the metal layer 512. The collector terminal 514 is connected to the lower electrode 104 of the piezoelectric device 102. The yoke 112 is basically unchanged, as well as, the upper electrode 106 which is connected to the gate terminal 516. In this case however, the lower portion of the yoke 112 is built by the substrate 518. Also for this embodiment, the equivalent circuit diagram for the transistor is shown in dashed lines.

FIG. 6 shows a block diagram of a sixth embodiment 600 of the inventive piezo-junction device. Generally, the arrangement corresponds in large parts to the embodiment 500 of FIG. 5. However, in this case, the substrate 602—in particular, an n-type substrate—is part of the transistor structure. Therefore, no metal layer is required as an emitter layer (layer 512 of FIG. 5), instead, the substrate 602 is used as the emitter contact. Thus, the emitter terminal 510 is connected to the substrate 602. Again, the lower portion of the yoke 112 is formed by the substrate 602. Again, the equivalent circuit diagram for the transistor is shown in dashed lines.

It may be noted that those embodiments having that piezoelectric device on top of the semiconductor junction device, may be easier to fabricate because no ambos-like structure is required between an upper portion of the yoke and the semiconductor junction device, as shown in FIG. 1 and FIG. 2. The piezoelectric device may be in direct mechanical contact with its upper electrode 106 with the upper portion of the yoke 112.

In summary—and taking into account the different embodiments presented—there are three different operation mechanisms induced used by the strain of the piezoelectric device: (i) in case of the Schottky diode a change in the barrier height is causing the change of the voltage/current characteristic; (ii) in case of the forward biased semiconductor pn junction a shift in the threshold voltage can be achieved by a shifting of the Fermi levels on either side of the junction, which causes a disproportional increase in current; (iii) in case of the reverse biased tunnel diode the result of the strain applied is an increase in the tunnel current.

An advantageous target application area for all proposed devices are low voltage logic devices for IoT (Internet of Things) applications in midrange frequencies, e.g., 0.1-10 GHz. The upper limit may be given by the sound of speed in the piezoelectric material and its thickness.

Aspects of the present invention are described herein with reference to e.g., flowchart illustrations and/or block diagrams of methods, apparatus (systems), and computer programs products according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the figures illustrate the architecture, functionality, and operation of possible implementations of systems, and methods, according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A piezo-junction device, comprising:
a piezoelectric element comprising two electrodes and a piezoelectric material disposed in between the two electrodes;
a semiconductor junction device with a voltage/current characteristic and a Fermi level, the semiconductor junction device being adjacent to the piezoelectric element such that one of the two electrodes of the piezoelectric element in contact with the semiconductor junction device connect the semiconductor junction device and the piezoelectric element electrically in series, the semiconductor junction device having at least one junction;
a fixed mechanical clamp;
a substrate made of a semiconductor doped with a dopant having a dopant type, the substrate being attached to the fixed mechanical clamp forming a yoke with the fixed mechanical clamp, both the piezoelectric element and the junctions of the semiconductor junction device sitting within the yoke and the substrate in contact with at least one layer of the semiconductor junction device to form one of the junctions of the semiconductor junction device,
wherein the piezoelectric element with an applied electrical field applies strain to the semiconductor junction device causing a change in the voltage/current characteristic of the semiconductor junction device.

2. The piezo-junction device according to claim 1, wherein the junctions include one or more of the following: a p-n junction, a junction of a semiconductor with a metal, a tunnel diode, and a junction formed between the substrate and the at least one layer of the semiconductor junction device disposed on the substrate.

3. The piezo-junction device according to claim 1, wherein the yoke has a high Young's modulus.

4. The piezo-junction device according to claim 3, wherein the high Young's modulus has a value between 100 and 300 GPa.

5. The piezo-junction device according to claim 1, wherein a ratio of a dimension of a cross section of the piezoelectric element to a dimension of a cross section of the semiconductor junction device is 25:1 or larger and the voltage/current characteristic changes by a factor greater than 10.

6. The piezo-junction device according to claim 1, wherein the semiconductor junction device is in physical and electrical contact with the substrate.

7. The piezo-junction device according to claim 1, wherein the fixed mechanical clamp is a micro-cavity within a semiconductor bulk material.

8. The piezo-junction device according to claim 1, wherein the dopant type is a p-type dopant, the substrate is doped to form a p-type substrate, and a n-type layer is the at least one layer of the semiconductor junction device that form the junction with the substrate being a p-n homojunction.

9. The piezo-junction device according to claim 1, wherein the semiconductor junction device is a homojunction device or a heterojunction device.

10. The piezo-junction device according to claim 1, wherein an active portion of the piezoelectric device is selected out of the materials ZnO, Si, III-V semiconductors and II-VI semiconductors.

11. The piezo-junction device according to claim 1, wherein the dopant type is n-type, the substrate is doped to form an n-type substrate forming an emitter contact of a transistor.

* * * * *